United States Patent [19]
Leiphart

[11] Patent Number: 6,090,246
[45] Date of Patent: Jul. 18, 2000

[54] METHODS AND APPARATUS FOR DETECTING REFLECTED NEUTRALS IN A SPUTTERING PROCESS

[75] Inventor: Shane P. Leiphart, Boise, Id.

[73] Assignee: Micron Technology, Inc., Boise, Id.

[21] Appl. No.: 09/009,288

[22] Filed: Jan. 20, 1998

[51] Int. Cl.[7] .................................................. C23C 14/34
[52] U.S. Cl. ............................. 204/192.13; 204/192.12; 204/298.03
[58] Field of Search ........................ 204/192.12, 192.13, 204/298.03, 298.06, 298.08, 298.11, 298.16

[56] References Cited

U.S. PATENT DOCUMENTS

| | | | |
|---|---|---|---|
| 4,579,639 | 4/1986 | Enomoto et al. | 204/192 N |
| 4,895,631 | 1/1990 | Wirz et al. | 204/192.13 |
| 4,931,158 | 6/1990 | Bunshah et al. | 204/192.29 |
| 4,957,605 | 9/1990 | Hurwitt et al. | 204/192.12 |
| 5,192,894 | 3/1993 | Teschner | 315/111.21 |
| 5,423,970 | 6/1995 | Kugler | 204/298.03 |
| 5,807,467 | 9/1998 | Givens et al. | 204/192.12 |

FOREIGN PATENT DOCUMENTS 4-276073  10/1992  Japan ............................. C23C 14/54

OTHER PUBLICATIONS

English translation of JP 4–276073, Oct. 1992.

Primary Examiner—Nam Nguyen
Assistant Examiner—Steven H. VerSteeg
Attorney, Agent, or Firm—Workman, Nydegger & Seeley

[57] ABSTRACT

Methods and apparatus for detecting neutral gas molecules reflected from a target material during a sputter deposition process are disclosed to improve the uniformity of sputter depositing a metal film on a substrate. In a preferred embodiment, an electrically grounded collimator is positioned between the target material and a substrate in a sputtering chamber to restrict a plasma in the chamber to an area away from the substrate. The plasma is prevented from inducing a negative voltage on the substrate, and voltage measurements in the chamber can be taken in the proximate vicinity of the substrate without electrical influence from the charged plasma. It has been discovered that when these voltage measurements show a measurable increase in voltage in the proximate vicinity of the substrate, high energy reflected neutrals are impacting upon the substrate. High energy reflected neutrals, which disadvantageously tend to disrupt the uniformity of the metal film being sputter deposited on the substrate, can then be lessened by altering various sputtering system parameters. When a measurable increase in voltage in the proximate vicinity of the substrate has been detected, the sputtering system parameters that can be altered to reduce the high energy neutrals impacting upon the substrate include changing the pressure within the sputtering chamber, changing the voltage of the target material, changing the distance between the target material and the substrate, and changing the gas used to sputter the target material to another gas having a different mass per sputtered atom ratio.

26 Claims, 2 Drawing Sheets

METHODS AND APPARATUS FOR DETECTING REFLECTED NEUTRALS IN A SPUTTERING PROCESS

BACKGROUND OF THE INVENTION

1. The Field of the Invention

The present invention relates generally to the deposition of metals on semiconductor substrates or wafers for use in the semiconductor industry. More specifically the present invention relates to methods and apparatus for more uniformly depositing such metals during a sputtering process by detecting the presence of reflected neutrals.

2. The Relevant Technology

Many deposition apparatus and techniques are known in the prior art for depositing metal film layers upon semiconductor substrates or wafers for use in the semiconductor industry. In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above. The term semiconductor substrate is contemplated to include such structures as silicon-on-insulator and silicon-on-sapphire. Of those deposition techniques, the predominant conventional techniques are evaporation, physical vapor deposition (PVD) and chemical vapor deposition (CVD). Although differing in their approaches to metal film deposition, each deposition technique must meet certain minimum criteria to be successfully employed. Since PVD processes frequently allows the conservation of the target material, improvements in step coverage and adhesion and affords better control of manufacturing parameters (i.e., deposition rates, target materials and system pressures), PVD processes are frequently favored over other existing methodologies.

One PVD process, commonly known as sputtering, takes place in a vacuum chamber where positively charged gas atoms are generated and attracted to a negatively charged target material, also in the vacuum chamber. As the ionized atoms are attracted to the target material, they accelerate, gain momentum and strike the target. This striking liberates atoms and molecules of the target material, some of which fall to rest on semiconductor substrates positioned beneath the target material near the bottom of the vacuum chamber. Thereafter, the semiconductor substrate is coated with a layer of metal which is then patterned into a circuit, for example.

One problem with sputtering is that sometimes the metal coating applied to the substrate is not uniform. Although not necessarily a problem for all types of applications utilizing this technique, in the semiconductor industry when layer thicknesses are often 5 microns or less, non-uniform layer thicknesses can sometimes cause catastrophic failures during manufacture and use of the devices on which they are fabricated. Such failures can be electrically or mechanically related. Electrical failures include electrical shorting, insufficient resistance levels and introduction of induced electrical charges. Mechanical failures include fracture because of insufficient mechanical strength and malformations such as pinholes.

Although some sputtering equipment systems are available that generally improve uniformity these systems are expensive. They not only involve high capital costs as an initial investment but also as changes, retrofits and calibrations occur. Additionally, these systems are technologically sophisticated and complicate the design processes thereof.

In general, uniformity problems are caused by various sources. One known source is neutral gas molecules that are reflected from the target material during the sputtering process. The reflected neutrals reflect off the target material and erosion tracks thereof, i.e., ruts, which are non-uniform. As a result, the growth of the metallic film is correspondingly non-uniform. The reflected neutrals also bombard the metallic film on the semiconductor substrate in a non-uniform manner which likewise adversely impacts the uniform deposition and growth of the metallic film.

Reflected neutrals are also known to be a source of re-sputtering which is also problematic to the deposited metallic film, especially when the target material is multi-compositional. For example, when the target material has more than one component, such as aluminum-copper or titanium-tungsten, the reflected neutrals during re-sputtering, again reflecting off of non-uniform erosion tracks, can potentially cause variances in the sputtering rates of the various compositions. In turn, non-uniform composition densities of the metallic film deposited on the semiconductor substrate can be observed.

Uniformity problems are even further complicated with multi-layer coatings because when a first film layer is non-uniform the next deposited layer assumes the contour of the first layer and is likewise non-uniform. This non-uniformity also continues with each additional layer deposited thereafter.

Accordingly, it is desirous to detect neutral gas molecules reflected from a target material during a sputter deposition process to, ultimately, afford improvement in the uniformity of metallic-film substrate coatings.

SUMMARY OF THE INVENTION

In accordance with the invention as embodied and broadly described herein, novel methods and apparatus for detecting neutral gas molecules reflected from a target material during a sputter deposition process are disclosed. Ultimately, detection of these reflected neutrals affords a notice of the need for adjustment to various sputtering process parameters so as to improve the uniformity of a sputter deposited film.

In a preferred embodiment, an electrically grounded collimator is used between the target material and a substrate in a sputtering chamber to restrict a plasma in the chamber to an area away from the substrate. In this manner, the positively charged plasma (with respect to ground) is prevented from inducing a large, negative voltage on the substrate. Additionally, voltage measurements in the chamber can be taken in the proximate vicinity of the substrate without electrical influence from the charged plasma It has been discovered that when these voltage measurements show a measurable increase in voltage in the proximate vicinity of the substrate, reflected neutrals have been detected. These reflected neutrals, which disadvantageously tend to disrupt the uniformity of the metal coating being deposited on the substrate, can then be lessened from impacting upon the coating by altering various other system parameters.

Voltage measurements are made by a voltage measuring device, such a voltage probe, that is inserted into the chamber and moved about a top surface of the substrate in close proximate relation thereto, without electrically contacting the substrate during the measurements. Parameters of the sputtering process can be changed with a voltage increase is detected by the voltage measuring device. The parameters include changing the pressure in the sputtering chamber, decreasing the voltage of the target material, increasing the distance between the target material and the substrate, and using a sputtering gas having a different mass per sputtered atom ratio.

These and other features of the present invention will become more fully apparent from the following description and appended claims, or may be learned by the practice of the invention as set forth hereinafter.

BRIEF DESCRIPTION OF THE DRAWINGS

In order to more fully understand the manner in which the above-recited and other advantages and objects of the invention are obtained, a more particular description of the invention will be rendered by reference to specific embodiments thereof which are illustrated in the appended drawings. Understanding that these drawings depict only typical embodiments of the invention and are not therefore to be considered to be limiting of its scope, the invention in its presently understood best mode for making and using the same will be described and explained with additional specificity and detail through the use of the accompanying drawings in which.

DETAILED DESCRIPTION OF THE PREFERRED EMBODIMENTS

In accordance with the invention as embodied and broadly described herein, a novel method and apparatus for detecting neutral gas molecules reflected from a target material during a sputter deposition process are disclosed. Ultimately, detection of these reflected neutrals affords improvement in the uniformity of metallic substrate coatings.

Figure 1:
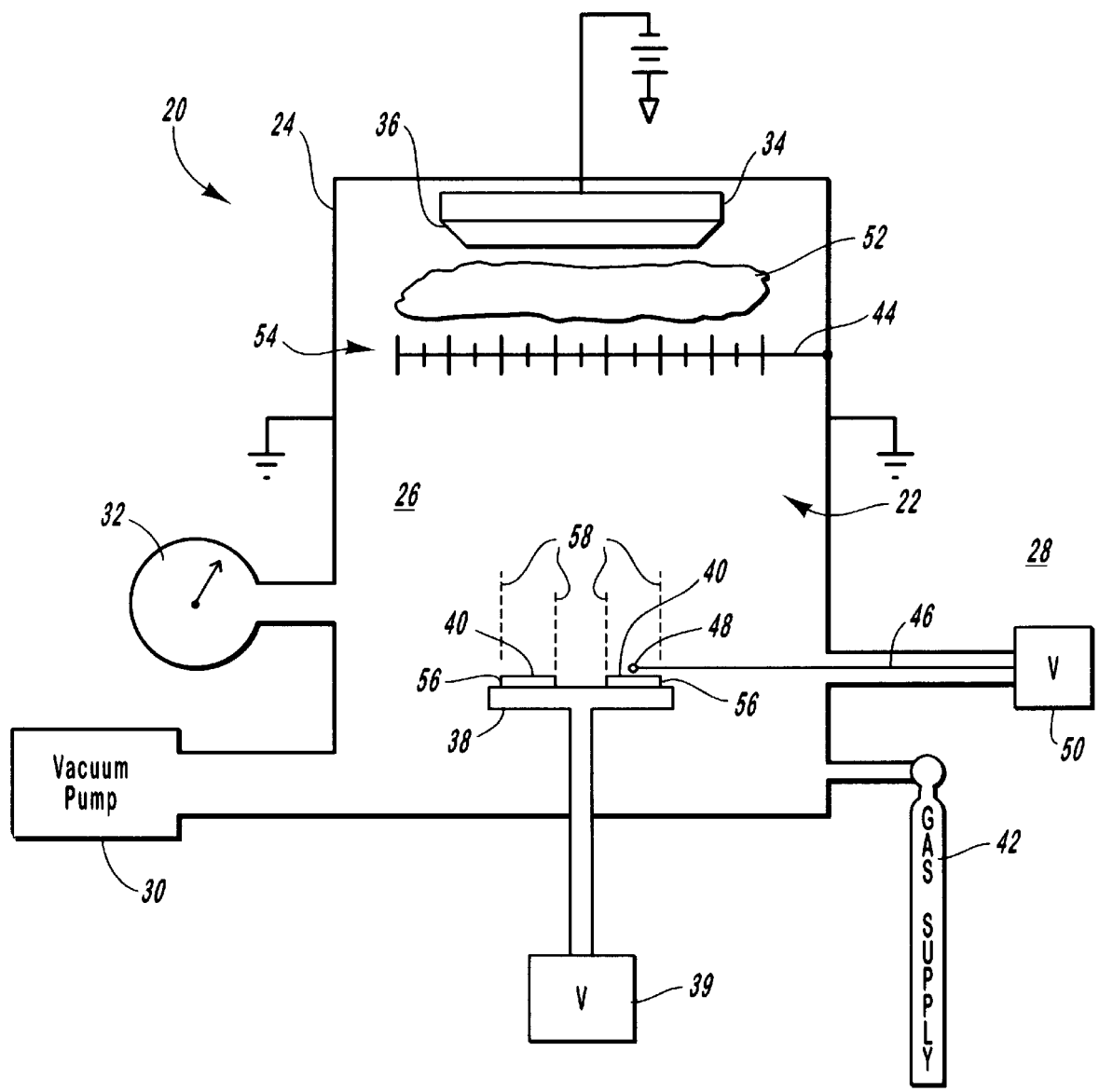
FIG. 1 is diagram of a sputtering chamber capable of detecting reflected neutrals in the proximate vicinity of the substrate.

With reference to FIG. 1, a sputtering chamber in accordance with the present invention capable of detecting reflected neutrals during a sputter deposition process is depicted generally as 20. The sputtering process causes atoms of target material to be dislodged from the surface of a target material by collision with high energy particles. Sputtering processes are widely used in many industries, including the semiconductor industry, to deposit metallic film layers on a substrate.

The sputtering chamber 20 has a vacuum chamber 22 with a surface 24 thereof defining an interior 26 and an exterior 28 of the vacuum chamber. The vacuum chamber provides a substantially contamination-free environment for the sputtering process. During the sputtering process, the vacuum created within the chamber increases the mean free path of the sputtered atoms and molecules, which in turn results in a more uniform and controllable deposition of metallic films.

The vacuum is created using a vacuum pump 30. Vacuum pump 30 may be any of a variety of pumps but is typically either an oil diffusion, cryogenic, ion, turbomolecular or titanium sublimation pump. The actual pump selected is generally based upon a number of engineering factors such as the vacuum pressure range required, the gas pumped, pumping speed, throughput, outgassing, costs, maintenance and other similar related factors. Providing assistance to an operator in establishing the vacuum during the sputtering process is a pressure gauge 32 exposed to the interior 26 of the vacuum chamber 22 by means well known to those skilled in the art.

Within the interior 26 of the vacuum chamber 22 is a target material holder 34, usually a cathode, for supporting a target material 36 during the sputtering process. Target material 36 is connected to target material holder 34 in intimate contact by means of a cooling device. The cooling device, such as a water-cooled backing plate (not shown), prevents heat build-up, warpage, and melting of target material 36, and prevents changes in deposition rates due to thermal restructuring. In this embodiment, the target material holder 34 is a magnetron cathode that facilitates confinement of electrons in the plasma 52, described later, near the target material 36 during the sputtering process.

Target material 36 used during the sputtering process can be of various, shapes, sizes and material compositions. The shape and size of target material 36 are well known embodiments and range from round to rectangular and from a few inches to several feet long. The material compositions are generally of high purity and are sometimes very low in alpha particle emission. Other desirable characteristics include a high percentage of target material utilization, the ability to perform a large number of processes between replacement, and accurate alloy composition. Composite target materials are also preferred materials consisting of two or more metals in unalloyed form having a selected ratio of surface area arranged so that sputtering takes place simultaneously therebetween to yield an alloy in the deposited metallic coating. Preferred target materials useful during the sputtering process, described in detail below, include, but are not limited to, aluminum, aluminum:copper, aluminum alloys, platinum, gold, titanium:tungsten, tungsten, titanium nitride, tungsten:silica and cobalt:silica. In some applications it is possible for the target materials to include molybdenum, silica, and refractory metal silicides, although these latter target materials are more typically suited to deposition by evaporation or CVD processes.

Also within the interior 26 of the vacuum chamber 22 is a pedestal 38 capable of electrically contacting and supporting at least one substrate 40. Substrate 40 has a top surface thereon upon which the sputtered target material 36 is to be sputter deposited during the sputtering process. The pedestal 38 is electrically connected to a voltmeter 39 whose operation will be described below, in detail, in the context of the sputtering process.

Gas is supplied to the interior 26 of the vacuum chamber 22 by gas supply 42. Inert gases having a large atomic mass relative to target material 36, such as argon, krypton and xenon, are most frequently selected for sputtering processes. Argon is typically favored because of its low cost and availability as compared to the other gasses. Still other gases may be selected and are frequently chosen based upon the pressure range of the process, the electrical characteristics thereof, and the ability of the gas to avoid interference with the growing metallic film being deposited on the substrate.

Completing the interior 26 of the vacuum chamber 22 is a restriction device 44 that is physically located between the target material holder 34 and the pedestal 38. During the sputtering process the restriction device 44 is between the target material 36 and the substrate 40. The restriction device is electrically grounded and may be physically attached to the surface 24 of the vacuum chamber 22 which is also electrically grounded. In this embodiment, the restriction device is a collimator but may be any other similar structure, such as a sieve, allowing sputtered atoms and reflected neutrals to pass therebetween en route to the substrate.

Inserted into the interior 26 of the vacuum chamber 22 is a voltage measurement device 46 in the form of a voltage probe having a probe tip 48. The voltage probe is electrically connected to a voltmeter 50 on the exterior 28 of the vacuum chamber 22 for making various voltage measurements which are more fully described below in the context of the sputtering process.

During the sputtering process, a plasma 52 is created in the vacuum chamber 22 by means well known to those skilled in the art for sputtering the target material 36 onto the substrate 40. During the sputtering process, positively charged ions of the inert gas are bombarded into the target material 36 to liberate ions and/or molecules therefrom which then pass through the collimator 44 and fall to rest on the substrate(s) 40 positioned beneath the target material 36 near the bottom of the vacuum chamber 22. Thereafter, the substrate 40 has sputter deposited thereon a metallic film which is then patterned into a circuit, for example. Once the bombarding ions of the inert gas liberate the target material 36, the inert gas molecules can reflect off the target material 36 as a high energy neutral gas molecule (hereinafter referred to as a reflected neutral) which causes uniformity problems for the growing metallic film.

It has been advantageously discovered that by restricting the plasma 52 to an area 54 in the vacuum chamber 22, away from the substrate 40, the electrically charged plasma 52 is unable to induce a negative voltage on the substrate 40 which typically occurs if the plasma 52 is unrestricted and able to occupy the regions of the vacuum chamber 22 near the substrate 40. Such induced voltages frequently achieve an electrical bias of about −20 volts. Restriction of the plasma 52 to area 54 is possible because, in this embodiment, the restriction device 44 is the electrically grounded collimator. The electrically grounded collimator acts as a ground plane and the electrically charged plasma 52 is essentially unable to penetrate therebeneath. In this manner, the substrate 40, the pedestal 38, and surrounding proximate vicinity can have voltage measurements taken that are essentially free from the electrical influence of the electrically charged plasma 52.

Figure 2:
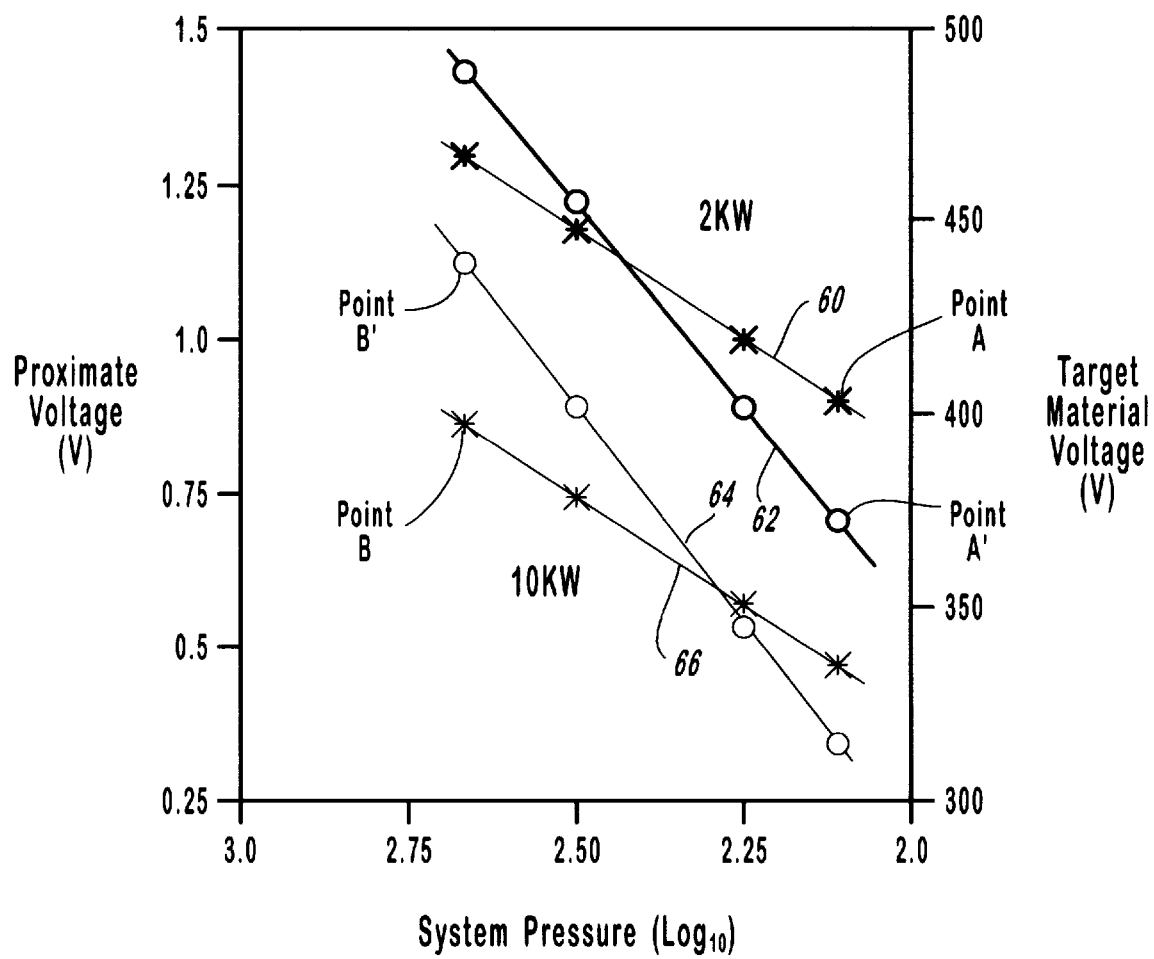
FIG. 2 is graphic representation of reflected neutrals causing voltage increases in the proximate vicinity of the substrate.

The reason for making these voltage measurements is best described with reference to FIG. 2. In FIG. 2, the X-axis is the system pressure of a vacuum chamber in a log base 10 scale. The Y-axis is a two-fold axis showing the voltage A) of the target material along the right hand side thereof, and showing along the left hand side thereof the voltage (V) of the vacuum chamber as recorded from a location in a close proximate relationship to a surface of the substrate (hereinafter referred to as the proximate voltage). The proximate voltage is measured by the voltage measurement device 46, in FIG. 1, and observed by voltmeter 50 attached thereto. The particular location about the substrate that the proximate voltage is observed and recorded is preferably from above the substrate, without touching the substrate or pedestal, within the confines of a vertical boundary defined by a periphery 56 of the substrate 40. The vertical boundary is illustrated in FIG. 1 by the dashed lines 58 extending generally upward from the periphery 56 of the substrate 40.

With reference to FIG. 2, it can be seen that since the negative electrical effect of the plasma has been restricted away from the substrate by the collimator, and the proximate voltage is measurably able to attain positive voltage instead of being negatively charged as occurs when the plasma is allowed to influence the substrate. From the graph, four substantially straight lines are indicated with lines 60 and 62 representing the target material power at a power of about 2K watts and lines 64 and 66 representing the target material power at a power of about 10K watts. Lines 60 and 66 correspond to the target material voltage and are indicated by "x" on the lines. Lines 62 and 64 correspond to the proximate voltage and are indicated by a "o" on the lines. Lines 62 and 64 also parallel one to another and are respectively represented by the straight-line equations:

$$y=-1.3797(x)-2.653 \text{(line 62)}$$

$$y=-1.3797(x)-2.353 \text{(line 64)}.$$

From the graph, it can also be seen that since both points A and point B, on respective target material voltage lines 60 and 66, have a target material voltage of about 400 volts, point A, corresponding to the 2K watt line, has much less target current than point B, corresponding to the 10K watt line.

It is known that as more gas ions bombard the target material more reflected neutrals are produced. It is correspondingly known that more target current will also produce more reflected neutrals. Point B, therefore, should have a greater target current than point A, and should have more reflected neutrals present during the sputtering process.

In accordance therewith, point B', on proximate voltage line 64 corresponding to point B, has a voltage of about 1.10 volts whereas point A', on proximate voltage line 62 corresponding to point A, has a voltage of about 0.70 volts. Although the pressure along the X-axis is different between points A/A' and B/B', the pressures are substantially the same and are substantially negligible with respect to the recorded proximate voltage. While the voltages are small, the reflected neutrals are nonetheless causing emission of enough secondary electrons from the substrate to cause the proximate voltage to increase. In this manner, the more reflected neutrals present, the higher the proximate voltage.

As a consequence, monitoring the proximate voltage is useful as an indication as to when there should an alteration in the sputtering system parameters of the vacuum chamber to prevent problems, such as a lack of uniformity in the sputter deposited metallic film on the substrate. The possible alterations vary but results therefrom can be substantially immediately observed by monitoring the proximate voltage to see if the proximate voltage changes. The sputtering system operations parameters include, but are not limited to, at least one of the following: (i) changing the pressure in the sputtering chamber to change the mean free path of the high energy reflected neutrals, altering the opportunity of the same to have energy reducing collisions with other particles, and alter the possibility of the high reflected neutrals reaching and impacting upon the substrate; (ii) changing the target material voltage or current to change the number and energy of the reflected neutrals; (iii) changing the distance between the substrate 40 and the target material 36 to alter the likelihood that the reflected neutrals will have energy reducing collisions with other particles, and to alter the opportunity for high energy neutral to reach and impact upon the substrate; and (iv) changing the gas introduced into the vacuum chamber into another gas having a different mass per sputtered atom ratio so as to alter the distance of travel of the reflected neutrals.

It is contemplated within the scope of this invention that by monitoring the voltage of the pedestal 38, hence the voltage of the substrate 40, comparisons between the pedestal voltage and the proximate voltage will facilitate the determination as to which system parameter to alter. It is even further contemplated that, based upon the actual gas selected and the target material selected and the combination thereof, performance curves for the proximate voltage can be generated to even further facilitate the determination as to which of the foregoing sputtering system operations parameters should be altered.

It should also be appreciated that detection of the reflected neutrals, by measuring the proximate voltage at a plurality of locations within the vertical boundary of the substrate, will reveal regions or pockets of non-uniformity on the substrate coating since reflected neutrals reflect off of erosion tracks that are confined to specific areas on the target material. The foregoing enumerated alterations to the system parameters will similarly avoid the exacerbation of sputter deposition problems, such as the non-uniform thickness, film density, structure and composition of the metal film being sputter deposited.

The type and kind of voltage measurement device 46 in FIG. 1 should be selected so as to allow the device to be selectively positioned at varied locations within the vertical boundary illustrated in FIG. 1 by the dashed lines 58 extending generally upward from the periphery 56 of the substrate 40. The device should be able to be located at these plurality of locations without directly or electrically contacting the substrate or pedestal during the measuring of these voltage measurements.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method of detecting reflected neutrals during a physical vapor deposition process, the method comprising:
    providing a sputtering chamber;
    providing a substrate within said sputtering chamber;
    providing a target material within said sputtering chamber;
    creating a plasma within said sputtering chamber for sputtering said target material onto said substrate;
    sputtering said target material while said plasma is confined to an area in said sputtering chamber restricted from said substrate; and
    taking a plurality of voltage measurements with a voltage detection device in said chamber in proximate spaced relation to said substrate without said voltage detection device being in electrical contact with said substrate, the voltage detection device being positioned in spaced relation out of contact with said substrate between the substrate and the plasma, said plurality of voltage measurements being taken by moving said voltage detection device about a surface of said substrate.

2. A method according to claim 1, wherein sputtering said target material while said plasma is confined to an area in said sputtering chamber restricted front said substrate includes inserting an electrically grounded collimator between said target material and said substrate.

3. A method according to claim 1, wherein said taking a plurality of said voltage measurements by moving said voltage detection device about said surface of said substrate further comprises moving said voltage detection device above said substrate within a vertical boundary of said substrate defined by a periphery of said substrate.

4. A method according to claim 1, further comprising, in response to said plurality of voltage measurements, altering at least one system parameter selected from the group consisting of:
    changing a system pressure within said chamber;
    changing a target voltage of said target material;
    changing a target current of said target material;
    changing a distance between said substrate and said target material; and
    changing an inert gas in said plasma to a gas having a different mass per atom ratio.

5. A method of improving uniformity of a substrate coating during a physical vapor deposition process, comprising:
    providing a sputtering chamber;
    providing a substrate within said sputtering chamber;
    providing a target material within said sputtering chamber for depositing atoms or molecules thereof onto said substrate;
    introducing a gas into said sputtering chamber to create a plasma therein to sputter said target material during a sputtering process;
    restricting said plasma to an area away from said substrate;
    monitoring a voltage with a voltage measurement device in said sputtering chamber during said sputtering process in proximate relation to said substrate and away from said plasma without said voltage measurement device being in electrical contact with said substrate while said voltage is being monitored; and
    increasing a system pressure within said sputtering chamber in response to said voltage in said sputtering chamber.

6. A method of improving uniformity of a substrate coating during a physical vapor deposition process, comprising:
    providing a sputtering chamber;
    providing a substrate within said sputtering chamber;
    providing a target material within said sputtering chamber for depositing atoms or molecules thereof onto said substrate;
    introducing a gas into said sputtering chamber to create a plasma therein to sputter said target material during a sputtering process;
    restricting said plasma to an area away from said substrate;
    monitoring a voltage with a voltage measurement device in said sputtering chamber during said sputtering process in proximate relation to said substrate and away from said plasma without said voltage measurement device being in electrical contact with said substrate while said voltage is being monitored; and
    increasing a distance between said substrate and said target material in response to said voltage in said sputtering chamber.

7. A method of improving uniformity of a substrate coating during physical vapor deposition process, comprising:
    providing a sputtering chamber;
    providing a substrate within said sputtering chamber;
    providing a target material within said sputtering chamber for depositing atoms or molecules thereof onto said substrate;

introducing a gas into said sputtering chamber to create a plasma therein to sputter said target material during a sputtering process;

restricting said plasma to an area away from said substrate;

monitoring a voltage with a voltage measurement device in said sputtering chamber during said sputtering process in proximate relation to said substrate and away from said plasma without said voltage measurement device being in electrical contact with said substrate while said voltage is being monitored; and changing said gas introduced into said sputtering chamber into a gas having a heavier mass per spluttered atom ratio in response to said voltage in said sputtering chamber.

8. A method of improving uniformity of a substrate coating during a sputtering process, comprising:

providing a sputtering chamber;

providing a substrate positioned within said sputtering chamber by a pedestal that is in electrical contact therewith;

providing a target material within said sputtering chamber in a spaced relation with said substrate and separated therefrom by an electrically grounded collimator;

creating a plasma within said sputtering chamber between said target material and said collimator for sputtering said target material through said collimator onto said substrate during a sputtering process;

taking a plurality of voltage measurements with a voltage measurement device in said sputtering chamber in proximate relation to said substrate between said substrate and said collimator without said voltage measurement device being in electrical contact with said substrate while each said voltage measurement is being taken, said plurality of voltage measurements being taken by moving said voltage measurement device about a surface of said substrate during said sputtering process; and increasing a system pressure within said sputtering chamber in response to said voltage measurements.

9. A method according to claim 8, further comprising:

monitoring a voltage of said pedestal; and comparing said monitored voltage of said pedestal and each said voltage measurement.

10. A method of improving uniformity of a coating on a substrate during a sputtering process, comprising:

providing a sputtering chamber;

providing a substrate within said sputtering chamber positioned therein by a pedestal that is in electrical contact therewith;

providing a target material within said sputtering chamber for depositing atoms or molecules thereof onto said substrate;

creating a plasma with an inert gas within said sputtering chamber in an area thereof restricted away from said substrate to bombard said target material with ions of said inert gas during a sputtering process to liberate said atoms or molecules from said target material in order to deposit a metallic coating on said substrate;

taking a plurality of voltage measurements during said sputtering process with a voltage measurement device in said chamber in proximate relation to said substrate and away from said plasma without said voltage measurement device being in electrical contact with said substrate while each said voltage measurement is being taken, said plurality of voltage measurements being taken by moving said voltage measurement device above a surface of said substrate and within a vertical boundary of said substrate, said vertical boundary defined by a periphery of said substrate;

monitoring a voltage of said pedestal; and comparing said monitored voltage of said pedestal and said voltage measurements to derive therefrom an alteration to at least one system parameter and thereby to change said voltage measurements in said sputtering chamber.

11. A method according to claim 10, wherein said taking a plurality of voltage measurements comprises inserting a voltage probe electrically connected to a voltmeter into said chamber from a side thereof.

12. A method according to claim 10, wherein said pedestal supports a plurality of substrates and said taking a plurality of voltage measurements further comprises moving said voltage measurement device about a surface of each said substrate.

13. A method according to claim 10, wherein said creating a plasma within said sputtering chamber in an area thereof restricted away from said substrate further comprises inserting and electrically grounding a collimator between said target material and said substrate.

14. A method according to claim 10, wherein said altering said system parameter is selected from the group consisting of:

changing a system pressure within said chamber;

changing a target voltage of said target material;

changing a target current of said target material;

changing a distance between said substrate and said target material; and changing said inert gas introduced into said chamber into a gas having a different mass per sputtered atom ratio.

15. A method of improving uniformity of a substrate coating during a sputtering process, comprising:

providing a sputtering chamber;

providing a substrate positioned within said sputtering chamber by a pedestal that is in electrical contact therewith;

providing a target material within said sputtering chamber in a spaced relation with said substrate and separated therefrom by an electrically grounded collimator;

creating a plasma within said sputtering chamber between said target material and said collimator for sputtering said target material through said collimator onto said substrate during a sputtering process;

taking a plurality of voltage measurements with a voltage measurement device in said sputtering chamber in proximate relation to said substrate between said substrate and said collimator without said voltage measurement device being in contact with said substrate while each said voltage measurement is being taken, said plurality of voltage measurements being taken by moving said voltage measurement device about a surface of said substrate during said sputtering process; and altering a distance between said substrate and said target material in response to said voltage measurements.

16. A method according to claim 15, further comprising:

monitoring a voltage of said pedestal; and comparing said monitored voltage of said pedestal and each said voltage measurement.

17. A method of improving uniformity of a substrate coating during a sputtering process, comprising:
providing a sputtering chamber;
providing a substrate positioned within said sputtering chamber by a pedestal that is in electrical contact therewith;
providing a target material within said sputtering chamber in a spaced relation with said substrate and separated therefrom by an electrically grounded collimator;
creating a plasma within said sputtering chamber between said target material and said collimator for sputtering said target material through said collimator onto said substrate during a sputtering process;
taking a plurality of voltage measurements with a voltage measurement device in said sputtering chamber in proximate relation to said substrate between said substrate and said collimator without said voltage measurement device being in contact with said substrate while each said voltage measurement is being taken, said plurality of voltage measurements being taken by moving said voltage measurement device about a surface of said substrate during said sputtering process; and
changing said gas introduced into said sputtering chamber into a gas having a heavier mass per sputtered atom ratio in response to said voltage measurements.

18. A method according to claim 17, further comprising:
monitoring a voltage of said pedestal; and
comparing said monitored voltage of said pedestal and each said voltage measurement.

19. A method for sputtering a target material onto a substrate in a chamber from a target using a sputtering plasma that is confined to an area in the chamber that is restricted from said substrate, the method comprising:
providing a voltage detection device in spaced relation out of contact with said substrate between the substrate and the sputtering plasma;
taking a plurality of voltage measurements with the voltage detection device in the chamber in proximate spaced relation to said substrate by moving said voltage detection device about a surface of said substrate and without said voltage detection device being in contact with said substrate.

20. A method according to claim 19, further comprising, in response to said plurality of voltage measurements, altering at least one system parameter selected from the group consisting of;
changing a system pressure within the sputtering chamber;
changing a target voltage of said target material;
changing a target current of said target material;
changing a distance between said substrate and said target material; and
changing an inert gas in said sputtering plasma to a gas having a different mass per atom ratio.

21. A method for sputtering a target material onto a substrate in a chamber with a sputtering plasma that is restricted from the substrate in the chamber, the method comprising:
detecting a voltage with a voltage detection device situated:
between the substrate and the sputtering plasma;
away from the sputtering plasma; and
out of contact with said substrate while said voltage is being detected; and
altering the pressure within the chamber in response to the detected voltage.

22. A method for sputtering a target material onto a subtract in a chamber from a target using a sputtering plasma that is restricted from the substrate in the chamber, the method comprising:
detecting a voltage with a voltage detection device situated:
between the substrate and the sputtering plasma;
away from the sputtering plasma; and
out of contact with said substrate while said voltage is being detected; and
altering a distance between the substrate and the target in response to the detected voltage.

23. A method for sputtering a target material onto a substrate in a chamber with a sputtering plasma created from a gas, the sputtering plasma being confined to an area in the chamber that is restricted from said substrate, the method comprising:
detecting a voltage with a voltage detection device situated:
between the substrate and the sputtering plasma;
away from the sputtering plasma; and
out of contact with said substrate while said voltage is being detected; and
altering the gas introduced into the chamber to a gas having a heavier mass per sputtered atom ratio in response to the detected voltage.

24. A method for sputtering a target material onto a substrate in a chamber with a sputtering plasma that is confined in the chamber away from the substrate, the method comprising:
detecting a voltage with a voltage detection device situated:
between the substrate and the sputtering plasma;
away from the sputtering plasma; and
out of contact with said substrate while said voltage is being detected; and
altering a system parameter in response to the detected voltage.

25. A method according to claim 24, wherein said altering said system parameter comprises decreasing a target voltage of said target material.

26. A method for sputtering a target material onto a substrate in a chamber with a sputtering plasma, the method comprising:
sputtering said target material while said sputtering plasma is confined to an area in said sputtering chamber restricted from said substrate;
detecting a voltage with a voltage detection device, the voltage detection device being positioned in spaced relation out of contact with said substrate between the substrate and the sputtering plasma; and
altering, in response to the detected voltage, a system parameter that is selected from the group consisting of:
a system pressure within the sputtering chamber;
a target voltage of said target material;
a target current of said target material;
a distance between said substrate and said target material; and
an inert gas in said sputtering plasma to a gas having a different mass per sputtered atom ratio.

* * * * *

UNITED STATES PATENT AND TRADEMARK OFFICE
CERTIFICATE OF CORRECTION

PATENT NO. : 6,090,246
DATED : July 18, 2000
INVENTOR(S) : Shane P. Leiphart

It is certified that error appears in the above-identified patent and that said Letters Patent is hereby corrected as shown below:

Column 2,
Line 50, please change "to ground" to -- to the ground --
Line 5, please change "plasma It" to -- plasma. It --

Column 3,
Line 1, please change "increase is" to -- increase which is --

Column 5,
Line 47, please change "voltage A)" to -- voltage (V) --
Line 66, please change "as occurs" to -- which occurs --

Column 6,
Line 8, please change "also parallel" to -- are also parallel --

Column 8,
Line 61, please change "during physical" to -- during a physical --

Column 10,
Line 37, please change "sputtered atom ratio" to -- gas atom thereof --

Column 12,
Line 4, please change "subtract" to -- substrate --

Signed and Sealed this

Thirtieth Day of October, 2001

Attest:

NICHOLAS P. GODICI
*Attesting Officer*    *Acting Director of the United States Patent and Trademark Office*